(12) United States Patent
Sutardja (10) Patent No.: US 9,117,790 B2
(45) Date of Patent: Aug. 25, 2015

(54) METHODS AND ARRANGEMENTS RELATING TO SEMICONDUCTOR PACKAGES INCLUDING MULTI-MEMORY DIES

(71) Applicant: Marvell World Trade Ltd., St. Michael (BB)

(72) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/947,936

(22) Filed: Jul. 22, 2013

(65) Prior Publication Data

US 2014/0021598 A1    Jan. 23, 2014

Related U.S. Application Data

(60) Provisional application No. 61/674,703, filed on Jul. 23, 2012, provisional application No. 61/675,626, filed on Jul. 25, 2012.

(51) Int. Cl.
*H01L 23/48* (2006.01)
*H01L 23/52* (2006.01)
(Continued)

(52) U.S. Cl.
CPC ............... *H01L 23/36* (2013.01); *H01L 21/82* (2013.01); *H01L 24/73* (2013.01); *H01L 25/0652* (2013.01); *H01L 25/105* (2013.01); *H01L 24/13* (2013.01); *H01L 24/16* (2013.01); *H01L 24/29* (2013.01); *H01L 24/32* (2013.01); *H01L 24/48* (2013.01); *H01L 2224/0401* (2013.01); *H01L 2224/04042* (2013.01); *H01L 2224/06155* (2013.01); *H01L 2224/131* (2013.01); *H01L 2224/16145* (2013.01); *H01L 2224/16225* (2013.01); *H01L 2224/2919* (2013.01); *H01L 2224/32145* (2013.01); *H01L 2224/32225* (2013.01); *H01L 2224/4824* (2013.01); *H01L 2224/48145* (2013.01); (Continued)

(58) Field of Classification Search
USPC ......... 257/692, 675, 685, 686, 723, 730, 731, 257/733, 712, 713, 777, 778, 784, 796
See application file for complete search history.

(56) References Cited

U.S. PATENT DOCUMENTS 8,704,379 B2 * 4/2014 Crane et al. ................... 257/777
2003/0015792 A1   1/2003 Urakawa
(Continued)

FOREIGN PATENT DOCUMENTS

EP    1401020 A1    3/2004

*Primary Examiner* — A. Sefer
*Assistant Examiner* — Dilinh Nguyen (57) ABSTRACT

In an embodiment, there is provided a packaging arrangement comprising a substrate; a multi-memory die coupled to the substrate, wherein the multi-memory die comprises multiple individual memory dies, and each of the multiple individual memory dies is defined as an individual memory die within a wafer of semiconductor material during production of memory dies, and the multi-memory die is created by singulating the wafer of semiconductor material into memory dies, where at least one of the memory dies is the multi-memory die that includes the multiple individual memory dies that are still physically connected together; and a semiconductor die coupled to the multi-memory die and the substrate, wherein the semiconductor die is configured as a system on a chip, wherein at least one of the multi-memory die and the semiconductor die is attached to the substrate.

15 Claims, 11 Drawing Sheets

(51) Int. Cl.
*H01L 29/40* (2006.01)
*H01L 23/02* (2006.01)
*H01L 23/36* (2006.01)
*H01L 21/82* (2006.01)
*H01L 25/065* (2006.01)
*H01L 25/10* (2006.01)
*H01L 23/00* (2006.01)

(52) U.S. Cl.
CPC ........... *H01L 2224/48227* (2013.01); *H01L 2224/73207* (2013.01); *H01L 2224/73215* (2013.01); *H01L 2224/73253* (2013.01); *H01L 2224/73265* (2013.01); *H01L 2225/0651* (2013.01); *H01L 2225/06506* (2013.01); *H01L 2225/06562* (2013.01); *H01L 2225/06589* (2013.01); *H01L 2225/1023* (2013.01); *H01L 2225/1058* (2013.01); *H01L 2924/1434* (2013.01); *H01L 2924/1436* (2013.01); *H01L 2924/15311* (2013.01); *H01L 2924/15331* (2013.01); *H01L 2924/19107* (2013.01)

(56) References Cited

U.S. PATENT DOCUMENTS

| | | | |
|---|---|---|---|
| 2004/0164385 A1* | 8/2004 | Kado et al. | 257/678 |
| 2008/0160674 A1* | 7/2008 | Takiar et al. | 438/114 |
| 2012/0326282 A1* | 12/2012 | Sutardja | 257/621 |
| 2014/0206141 A1 | 7/2014 | Sutardja | |

* cited by examiner

METHODS AND ARRANGEMENTS RELATING TO SEMICONDUCTOR PACKAGES INCLUDING MULTI-MEMORY DIES

CROSS-REFERENCES TO RELATED APPLICATIONS

The present disclosure claims priority to U.S. Provisional Patent Application No. 61/674,703, filed Jul. 23, 2012, and U.S. Provisional Patent Application No. 61/675,626, filed Jul. 25, 2012, the disclosures of which are hereby incorporated by reference. The present disclosure is related to U.S. patent application Ser. No. 13/532,444, filed Jun. 25, 2012, and U.S. patent application Ser. No. 13/590,949, filed Aug. 21, 2012, the disclosures of which are hereby incorporated by reference.

TECHNICAL FIELD

Embodiments of the present disclosure relate to the field of integrated circuits, and more particularly, to techniques, structures, and configurations for semiconductor chip packaging.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Electronic devices utilize packages made up of semiconductor dies where the semiconductor dies are arranged and configured to perform various functions. For example, in a package, one semiconductor die may be configured as a system on a chip (SOC) while another semiconductor die may be configured as a memory die. The SOC die and the memory die are then interconnected to perform various functions for an electronic device that houses the package. The semiconductor dies in these packages often generate large amounts of heat. Additionally, the semiconductor dies need access to power (VDD) and ground. Thus, in creating and designing such packages, there are many trade-offs including, cost, heat dissipation and access to VDD and ground, as well as interconnectivity among the semiconductor dies within the package.

SUMMARY

In an embodiment, there is provided a packaging arrangement comprising a substrate; a multi-memory die coupled to the substrate, wherein the multi-memory die comprises multiple individual memory dies, and each of the multiple individual memory dies is defined as an individual memory die within a wafer of semiconductor material during production of memory dies, and the multi-memory die is created by singulating the wafer of semiconductor material into memory dies, where at least one of the memory dies is the multi-memory die that includes the multiple individual memory dies that are still physically connected together; and a semiconductor die coupled to the multi-memory die and the substrate, wherein the semiconductor die is configured as a system on a chip, wherein at least one of the multi-memory die and the semiconductor die is attached to the substrate.

In an embodiment, there is also provided a method comprising providing a substrate; coupling a multi-memory die to the substrate, wherein the multi-memory die comprises multiple individual memory dies, each of the multiple individual memory dies is defined as an individual memory die within a wafer of semiconductor material during production of memory dies, and the multi-memory die is created by singulating the wafer of semiconductor material into memory dies, where at least one of the memory dies is the multi-memory die that includes the multiple individual memory dies that are still physically connected together; coupling a semiconductor die to the multi-memory die and the substrate, wherein the semiconductor die is configured as a system on a chip; and attaching at least one of the multi-memory die and the semiconductor die to the substrate.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION

Figure 1A:
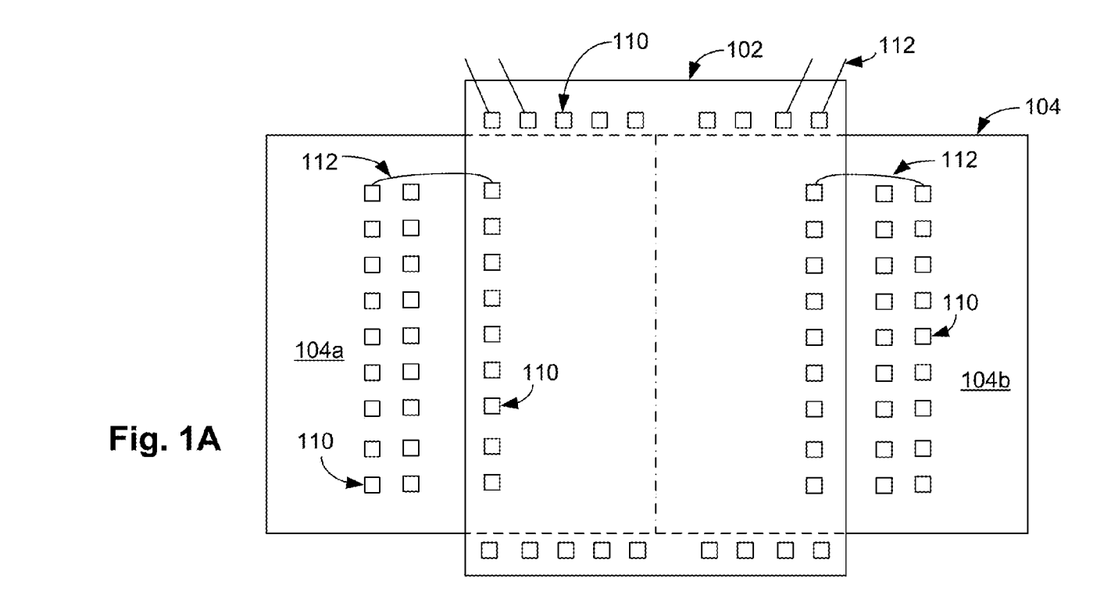
FIG. 1A schematically illustrates a top view of an example of a packaging arrangement including a multi-memory die that comprises two individual memory dies.

FIG. 1A illustrates a top view of a semiconductor die 102 configured as a system on a chip (SOC) die stacked on a semiconductor die 104 configured as a memory die. The memory die 104 comprises two separate dies 104a, 104b that were not physically separated from each other when the memory die 104 was manufactured. During manufacturing, a wafer (not illustrated) of semiconductor material that has been configured into a plurality of semiconductor dies for production of semiconductor dies is generally singulated or divided, for example, by cutting with a laser, into individual semiconductor dies in order to provide a plurality of individual semiconductor dies that have been physically separated from each other. Thus, a wafer (not illustrated) that was configured with a plurality of memory dies was cut such that the memory die 104 includes the two memory dies 104a, 104b that are still attached to each other. The memory dies 104a, 104b are generally configured as dynamic random access memory (DRAM), although they can be configured as other types of memory if desired.

Figure 1B:
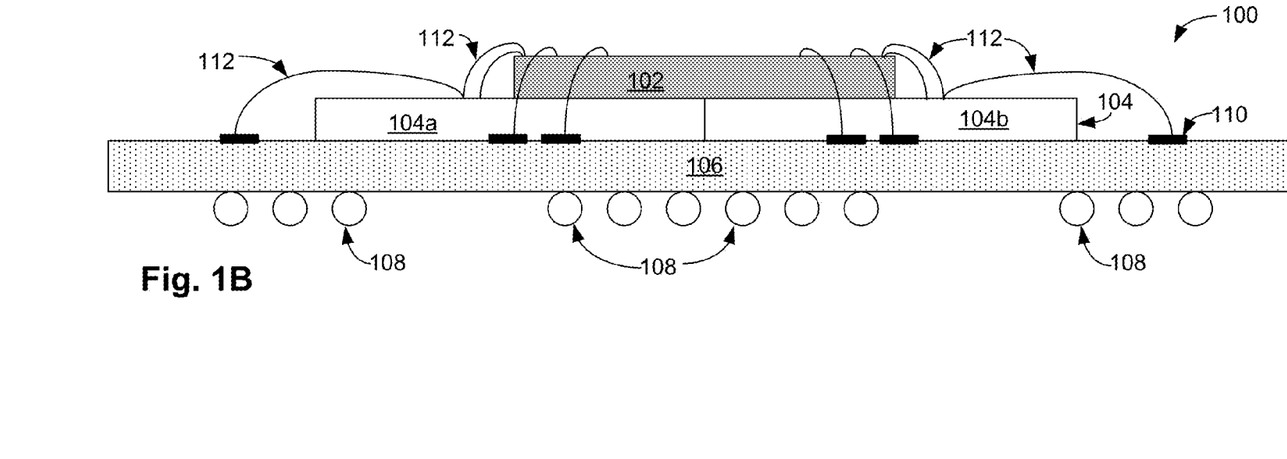
FIG. 1B schematically illustrates a cross-sectional view of the packaging arrangement illustrated in FIG. 1A.

FIG. 1B schematically illustrates a cross-sectional view of the packaging arrangement illustrated in FIG. 1A. FIG. 1B illustrates the SOC die 102 and the memory die 104 stacked on a substrate 106. The SOC die 102 is attached to the memory die 104 via an appropriate epoxy or glue. Likewise, the memory die 104 is attached to the substrate 106 via an appropriate epoxy or glue. The substrate 106 includes solder balls 108 for attaching the resulting packaging arrangement 100 to another substrate such as, for example, a printed circuit board (PCB), another substrate, etc. (not illustrated). Various bonding pads 110 on the SOC die 102, the memory die 104 and the substrate 106 can be coupled to one another with wire bonds 112 via a wire bonding process. The bonding pads 110 can be configured to be utilized for, for example, signals relating to data, commands and/or addresses, input/output, and access to VDD/ground. Furthermore, wire bonds 112 can be utilized between the SOC die 102 and the substrate 106, and between the memory die 104 and the substrate 106. For example, wire bonds 112 can be utilized to provide access to VDD/ground for the SOC die 102. The packaging arrangement 100 illustrated in FIG. 1B generally provides a reasonable cost but generally does not provide better than average heat dissipation for the SOC die 102 and the memory die 104. Additionally, the packaging arrangement 100 illustrated in FIG. 1A generally provides only minimal VDD/ground access.

Figure 1C:
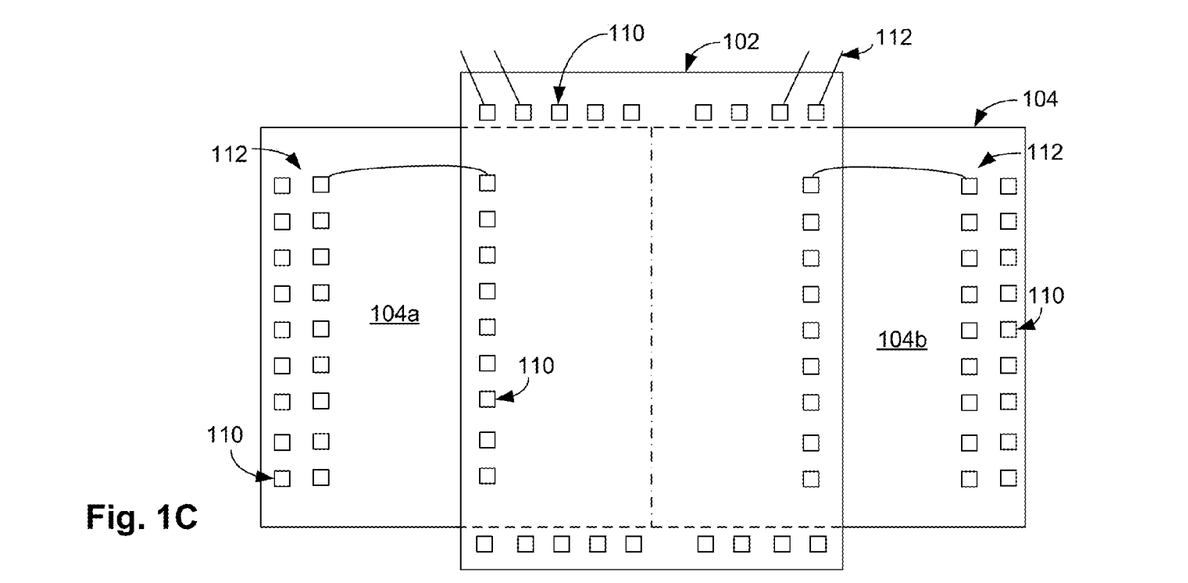
FIGS. 1C and 1D schematically illustrate a top view and a cross-sectional view, respectively, of an example of a packaging arrangement including a multi-memory die that comprises two individual memory dies.
Figure 1D:
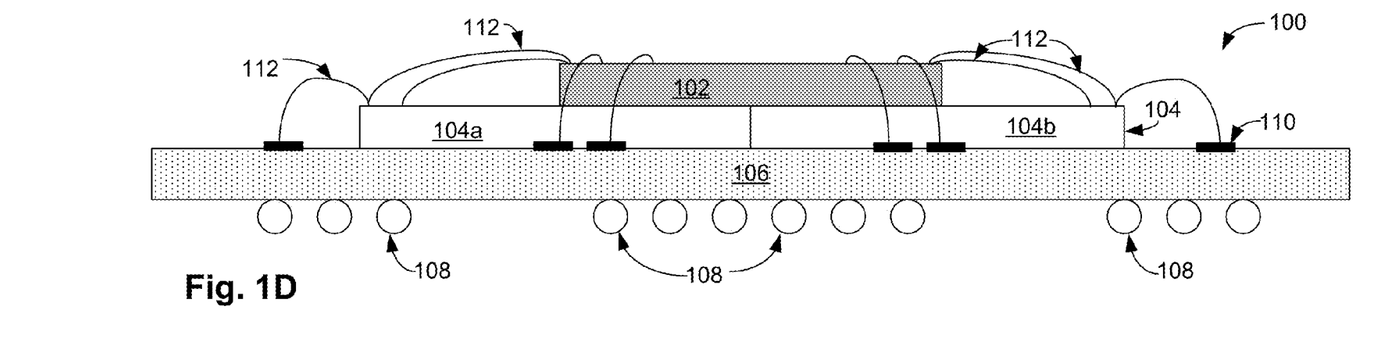

In FIGS. 1A and 1B, the bonding pads 110 of the memory die 104a are disposed on or near to a center section of the memory die 104a, and the bonding pads 110 of the memory die 104b are disposed on or near to a center section of the memory die 104b. However, in an embodiment, the bonding pads 110 of each of the memory dies 104a and 104b can be disposed, for example, near an edge of the corresponding memory die. For example, FIGS. 1C and 1D schematically illustrate a top view and a cross-sectional view, respectively, of an example of a packaging arrangement including a multi-memory die that comprises two individual memory dies. FIGS. 1C and 1D are to an extent similar to FIGS. 1A and 1B, respectively. However, unlike FIGS. 1A and 1B, in FIGS. 1C and 1D, the bonding pads 110 of the memory die 104a are disposed near an edge of the memory die 104a, and the bonding pads 110 of the memory die 104b are disposed near an edge of the memory die 104b. Having the bonding pads 110 disposed near the edges of the memory dies, for example, allows a relatively larger space for the SOC die 102 and consequently, a larger sized SOC die 102 can be used.

In an embodiment, the memory die 104a is a mirror image of the memory die 104b (e.g., the memory die 104a has components and bonding pad connections that are a mirror image those of the memory die 104b). In another embodiment, the memory die 104a is similar or identical to the memory die 104b (e.g., the memory die 104a has components and bonding pad connections that are similar or identical to those of the memory die 104b, and the memory die 104a is a rotation image of the memory die 104b in the figures). In yet another embodiment, the memory die 104a is different from the memory die 104b (e.g., the memory die 104a has components and bonding pad connections that are different from those of the memory die 104b). In an embodiment, the memory dies 104a and 104b form a dual channel memory. In an example, the memory dies 104a and 104b form a dual channel DRAM.

Figure 2A:
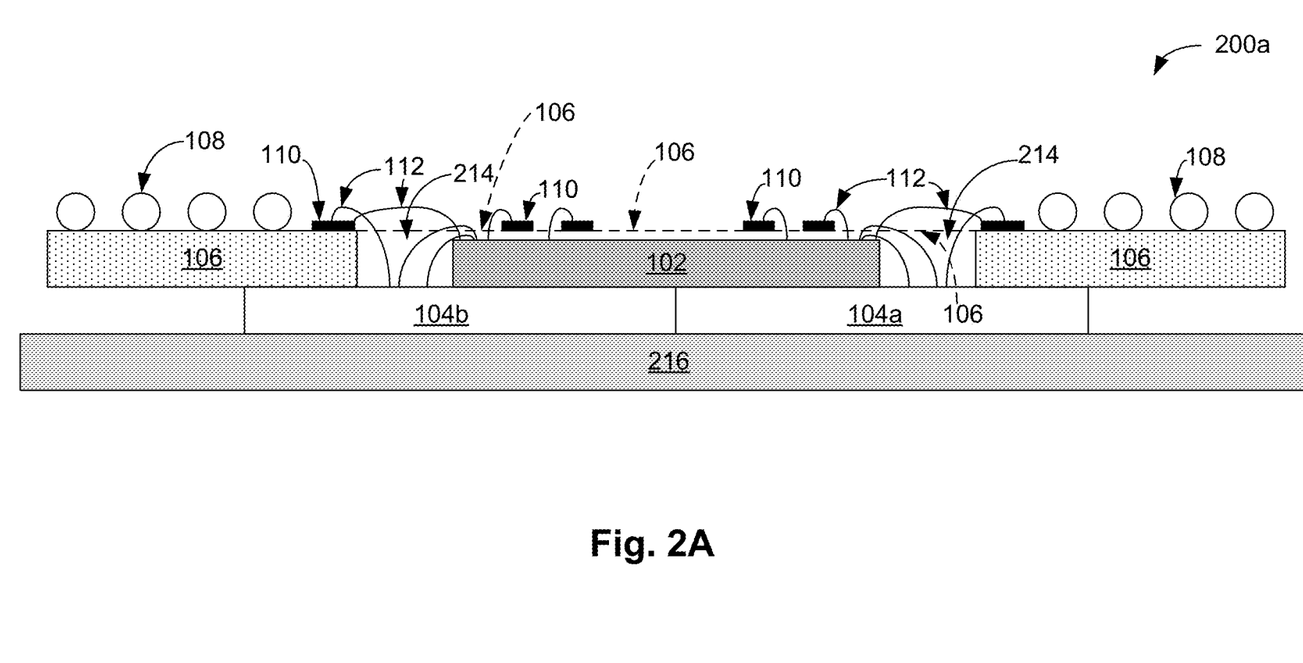
FIGS. 2-8 schematically illustrate cross-sectional views of various packaging arrangements including a multi-memory die that comprises two individual memory dies.

FIG. 2A illustrates a packaging arrangement 200a where a hole 214 is defined within a substrate 106. The packaging arrangement 200 includes an SOC die 102 and a memory die 104 that includes two attached memory dies 104a, 104b, as previously described. As can be seen, wire bonds 112 are utilized to provide various connections between the SOC die 102, the memory die 104 and/or the substrate 106. A heat sink 216 is provided and attached to the memory die 104. The heat sink 216 is attached to the memory die 104 via an appropriate epoxy or glue. Solder balls 108 are provided on the substrate 106 so that the packaging arrangement 200 can be attached to another substrate such as, for example, a PCB, another substrate, etc. (not illustrated). The SOC die 102 is attached to the memory die 104 via an appropriate epoxy or glue. As can be seen, when the memory die 104 is attached to the substrate 106 (via an appropriate epoxy or glue), the SOC die 102 extends into the hole 214. The packaging arrangement 200a illustrated in FIG. 2A generally provides good cost benefits, good heat dissipation for the SOC die 102 and very good heat dissipation for the memory die 104 due to the location of the heat sink 216 adjacent to the memory die 104. Additionally, the packaging arrangement 200a provides for improved VDD/ground access.

Figure 2B:
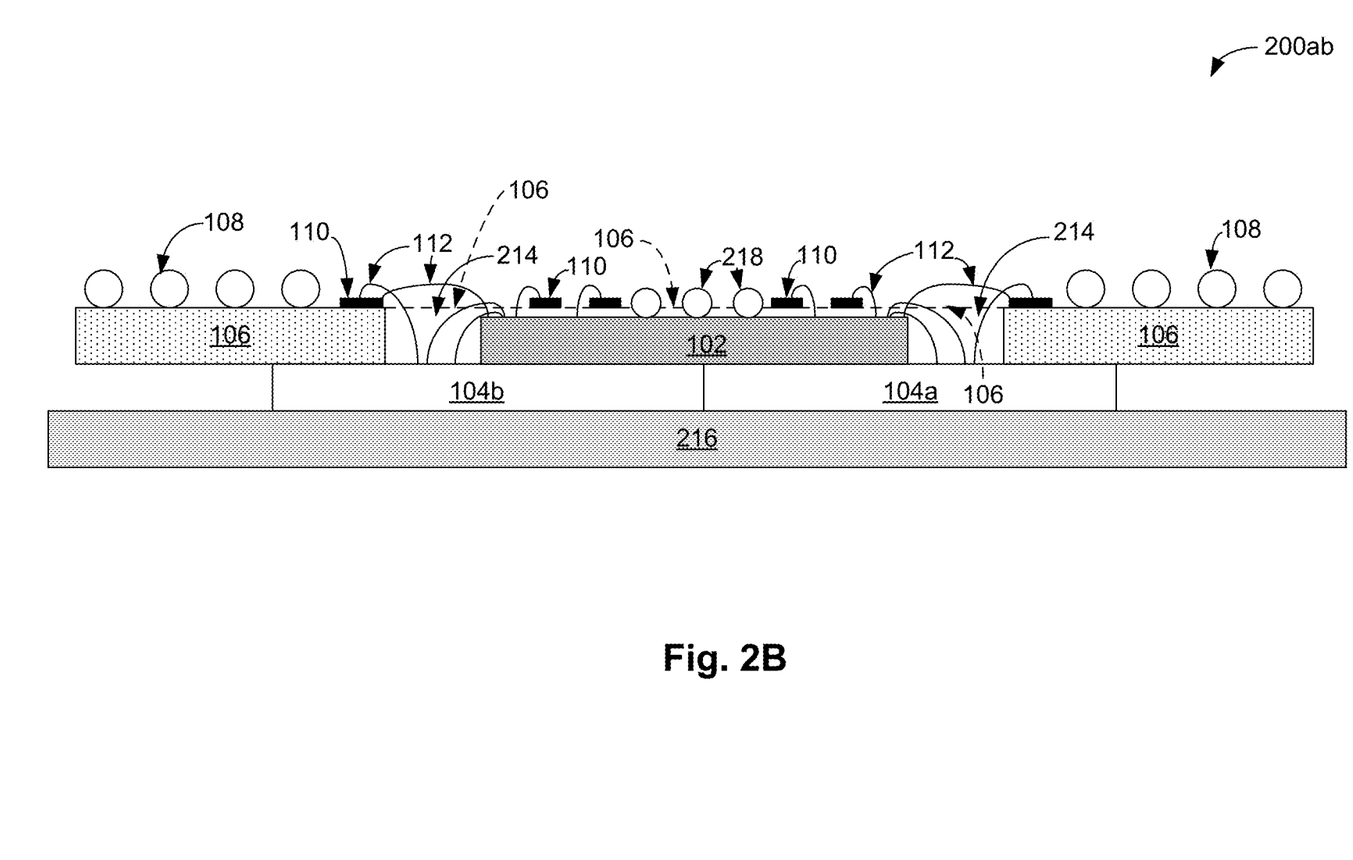

FIG. 2B illustrates a packaging arrangement 200b that is similar to the packaging arrangement 200a illustrated in FIG. 2A. In the packaging arrangement 200b, solder balls 218 are provided on the SOC die 102 to provide access to VDD and ground. The packaging arrangement 200b also provides good benefits with respect to cost and heat dissipation for the SOC die 102 and the memory die 104. Additionally, connectivity to VDD and ground is improved by the presence of the solder balls 218 on the SOC die 102 to thereby provide access to VDD and ground when the packaging arrangement 200b is flip chipped onto a substrate such as, for example, a PCB, another substrate, etc. (not illustrated)

Figure 3:
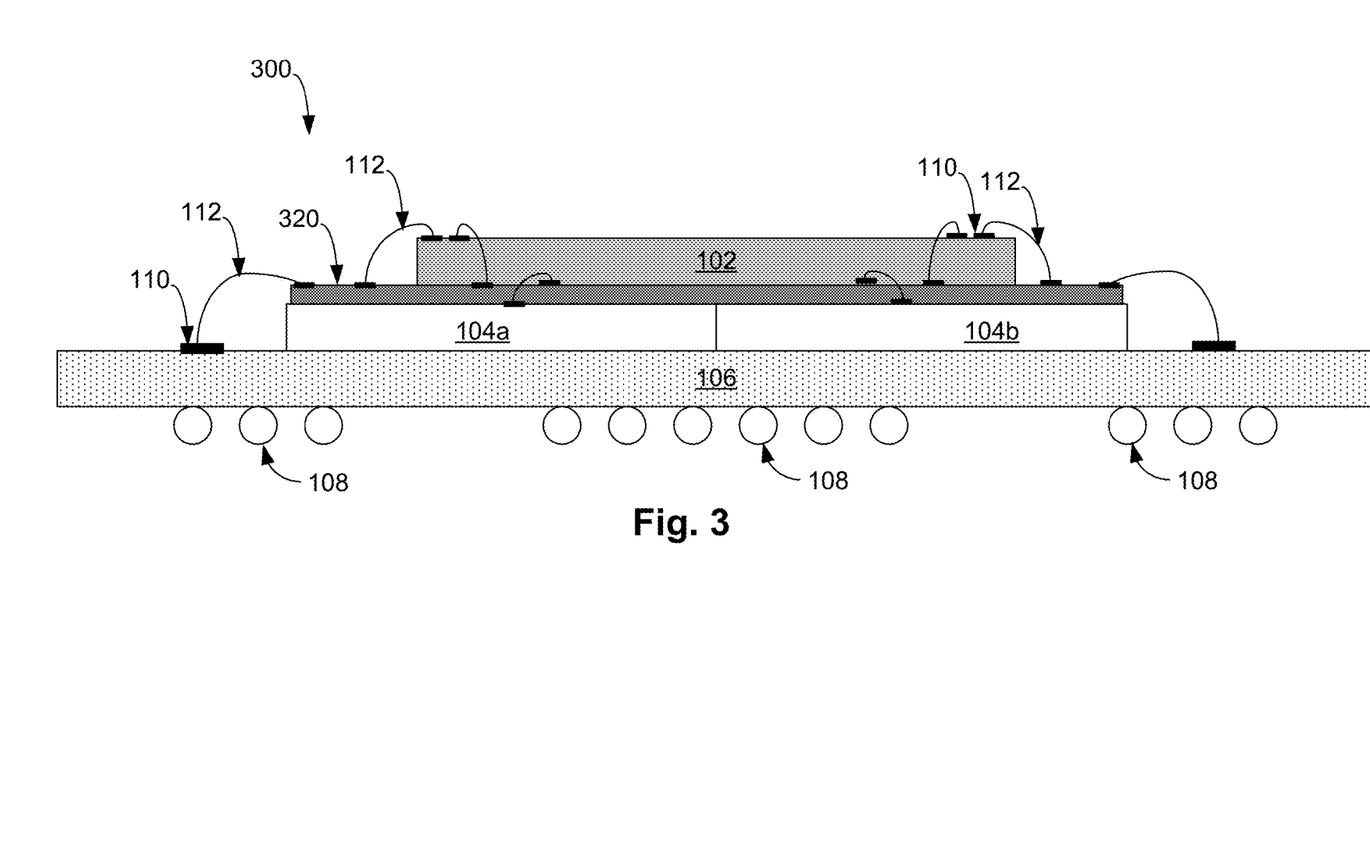

FIG. 3 illustrates a packaging arrangement 300 that is similar to the packaging arrangement 100 illustrated in FIG. 1B. In the packaging arrangement 300, a redistribution layer (RDL) 320 is disposed on the memory die 104. An SOC die 102 is placed on the RDL 320 and is attached to the RDL 320 via an appropriate epoxy or glue. Wire bonds 112 between the SOC die 102 and the RDL 320, as well as wire bonds 112 between the RDL 320 and the substrate 106, allow for routing of various signals such as, for example, data, commands/addresses, and access to VDD and ground. Solder balls 108 are included on the substrate 106 for attaching the packaging arrangement 300 to another substrate such as, for example, a PCB, another substrate, etc. (not illustrated). The packaging arrangement 300 of FIG. 3 has increased costs due to the inclusion of the RDL 320 and provides adequate heat dissipation for the SOC die 102 and the memory die 104, as well as adequate access to VDD and ground via the RDL 320.

Figure 4:
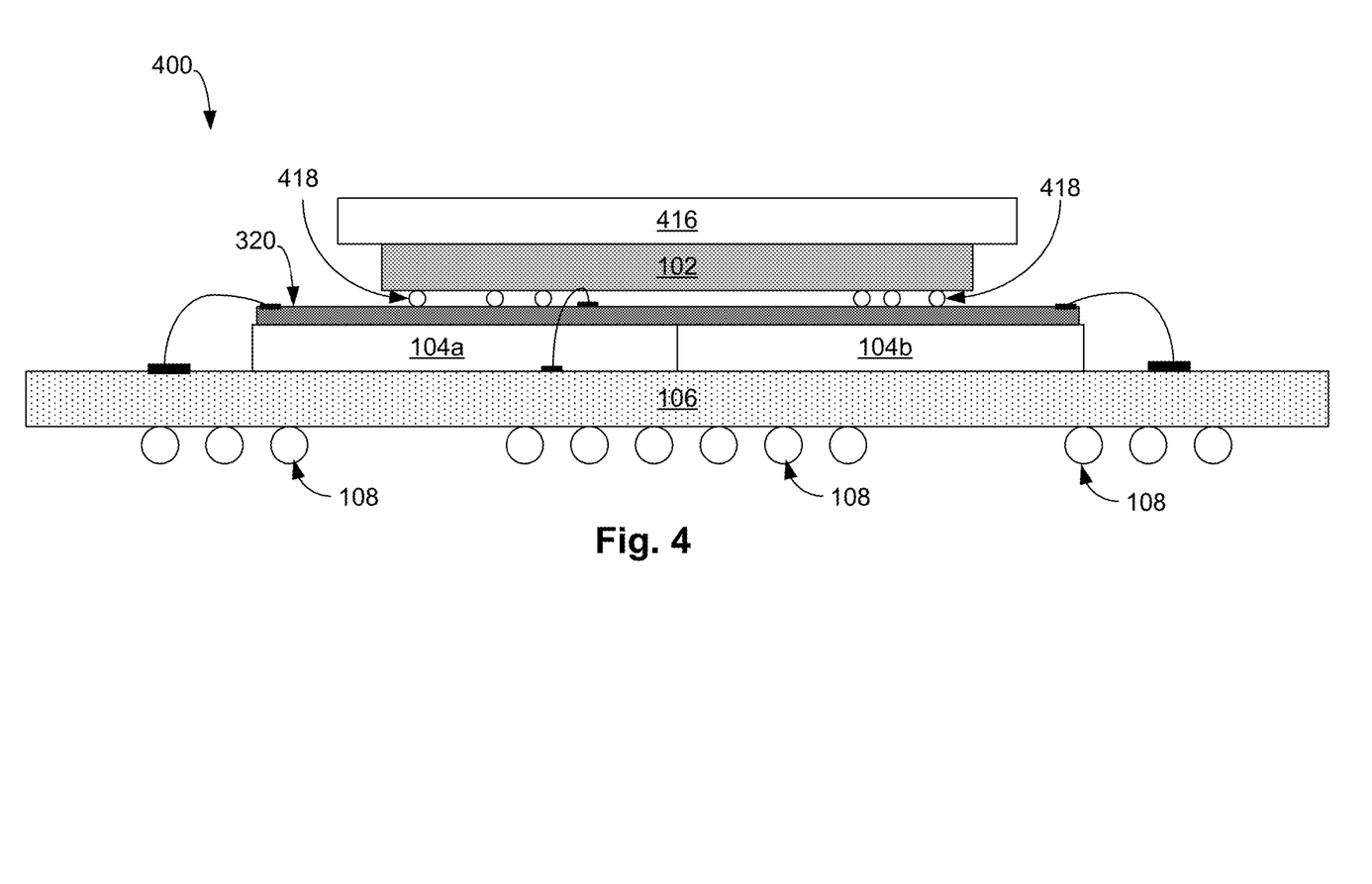

FIG. 4 illustrates a packaging arrangement 400 similar to the packaging arrangement 300 illustrated in FIG. 3. The SOC die 102 however is attached to the RDL 320 via solder balls 418, which thereby provide direct signal access between the SOC die 102 and the RDL 320. As can be seen, the SOC die 102 in the embodiments of both FIGS. 3 and 4 can be larger and can be almost square in comparison to the SOC die 102 that is illustrated in FIG. 1. This is allowable due to the presence of the RDL 320 as opposed to utilizing the bond pads on the memory die 104. A heat sink 416 is also provided in the packaging arrangement 400 and is attached to the SOC die 102 via an appropriate epoxy or glue. Solder balls 108 are provided on the substrate 106 for attaching the packaging arrangement 400 to another substrate such as, for example, a PCB, another substrate, etc. (not illustrated). The packaging arrangement 400 has increased costs and provides improved heat dissipation for the SOC die 102 as well as for the memory die 104 due to the presence of the heat sink 416. Improved access to VDD and ground is provided via the RDL 320.

Figure 5:
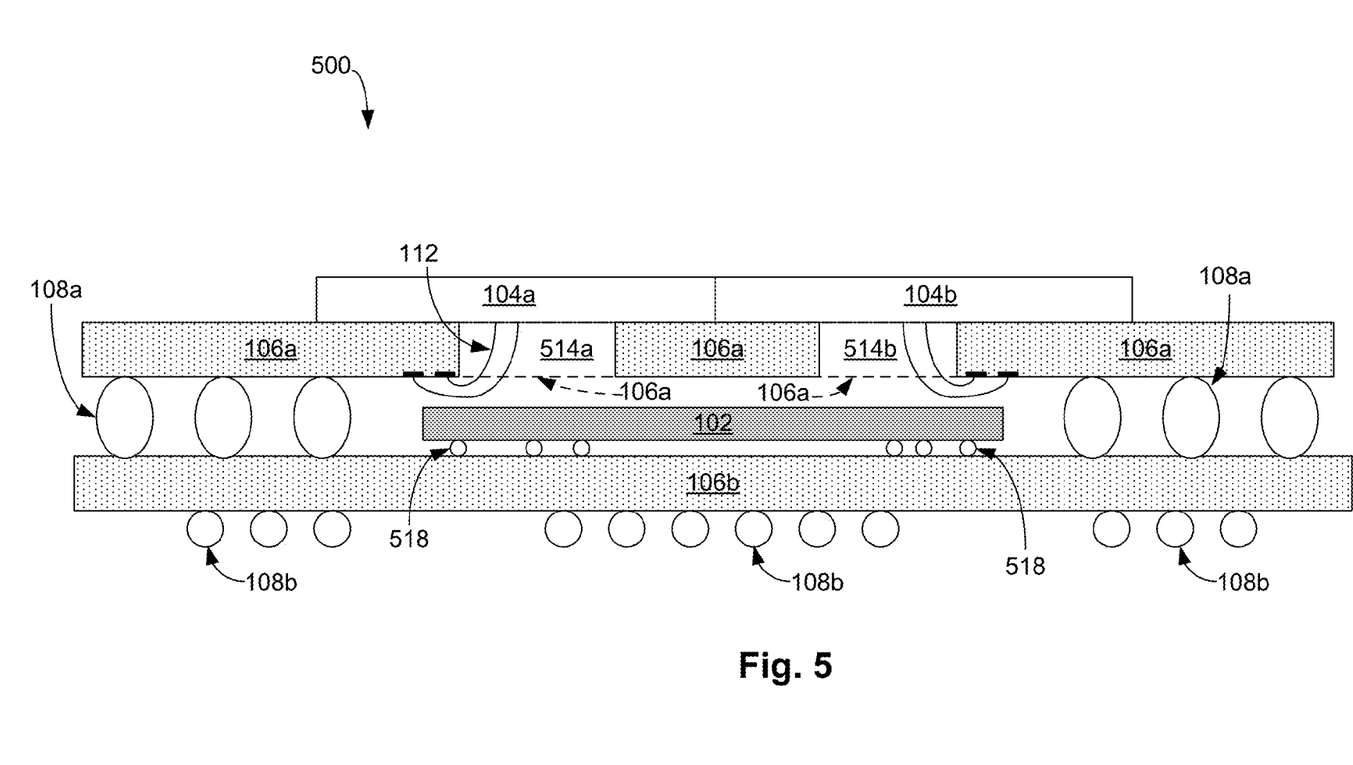

FIG. 5 illustrates a packaging arrangement 500 that is configured as a package on package (POP) arrangement. A memory die 104 that includes two attached memory dies 104a, 104b as previously described is attached to a first substrate 106a. The memory die 104 is attached to the substrate 106a via an appropriate epoxy or glue. Holes 514a, 514b are defined within the substrate 106a to allow for wire bonds 112 from the memory die 104 to the substrate 106a. A second substrate 106b is provided that includes the SOC die 102 disposed on the substrate 106b. The SOC die 102 is flip chip attached to the second substrate 106b and thus, the SOC die 102 is attached to the second substrate 106b via solder balls 518 to thereby provide direct signal connectivity between the SOC die 102 and the substrate 106b. The first substrate 106a with the memory die 104 attached thereto is attached to the second substrate 106b via solder balls 108a. Solder balls 108b are provided on the second substrate 106b to attach the POP packaging arrangement 500 to another substrate such as, for example, a PCB, another substrate, etc. (not illustrated). The packaging arrangement 500 generally has average costs associated therewith and provides a fair amount of heat dissipation for the SOC die 102 and the memory die 104. The access to VDD and ground for the SOC die 102 is very good due to the solder ball connection between the SOC die 102 and the second substrate 106b.

Figure 6:
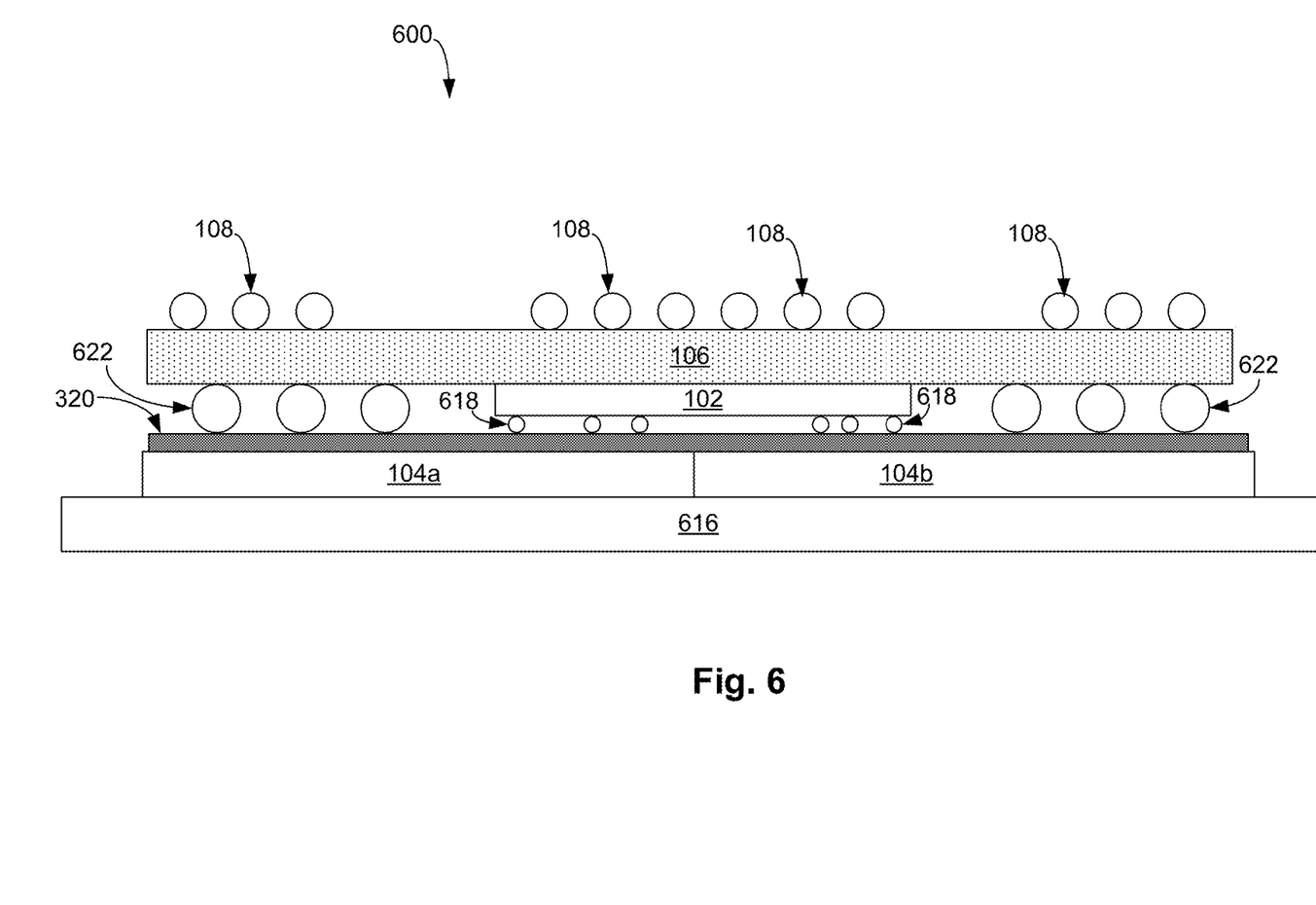

FIG. 6 illustrates a packaging arrangement 600 wherein a memory die 104 is attached to a heat sink 616. The memory die 104 is attached to the heat sink 616 via an appropriate epoxy or glue. The memory die 104 includes an RDL 320 disposed thereon. An SOC die 102 is flip chip attached via solder balls 618 to the RDL 320 on the memory die 104. Thus, the SOC die 102 has direct signal access to the RDL 320 via the solder balls 618 attaching the SOC die 102 to the RDL 320. The SOC die 102 is also attached to a substrate 106 via an appropriate epoxy or glue. Solder balls 622 are provided between the substrate 106 and the RDL 320 such that when the substrate 106 and SOC die 102 are flip chip attached to the RDL 320 on the memory die 104, direct signal access can be provided between the substrate 106 and the RDL 320. Solder balls 108 are provided on the substrate 106 to attach the packaging arrangement 600 to another substrate such as, for example, a PCB, another substrate, etc. (not illustrated). The packaging arrangement 600 provides improved cost and very good heat dissipation, due to the heat sink 616, for the SOC die 102 and the memory die 104. Additionally, access to the VDD and ground is also very good due to the RDL 320.

Figure 7:
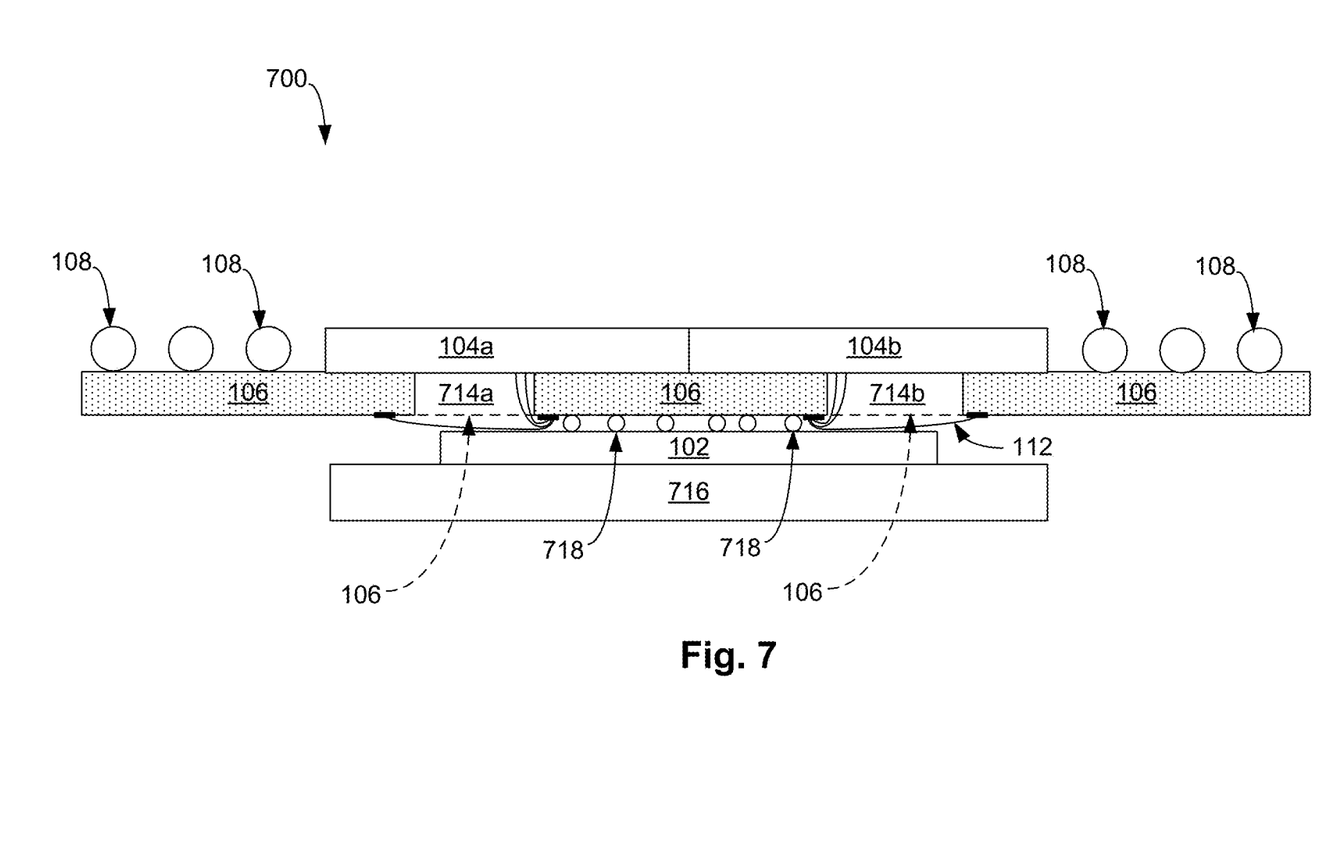

FIG. 7 illustrates a packaging arrangement 700 in which an SOC die 102 is attached to a heat sink 716. The SOC die 102 can be attached to the heat sink 716 via an appropriate epoxy or glue. A memory die 104 is attached to a substrate 106. The memory die 104 can be attached to the substrate 106 via an appropriate epoxy or glue. Holes 714a, 714b are defined within the substrate 106 so that wire bonds 112 can be utilized to couple the memory die 104 to the substrate 106 by routing the wire bonds 112 through the holes 714a, 714b within the substrate 106. The SOC die 102 can be flip chip attached to the substrate 106 and thus, solder balls 718 provide direct signal access between the substrate 106 and the SOC die 102. Solder balls 108 are provided on the substrate 106 so that the packaging arrangement 700 can be attached to another substrate such as, for example, a PCB, another substrate, etc. (not illustrated). The packaging arrangement 700 provides adequate cost and very good heat dissipation for the SOC die 102 as well as the memory die 104 due to the heat sink 716. Access to VDD and ground is generally adequate.

Figure 8:
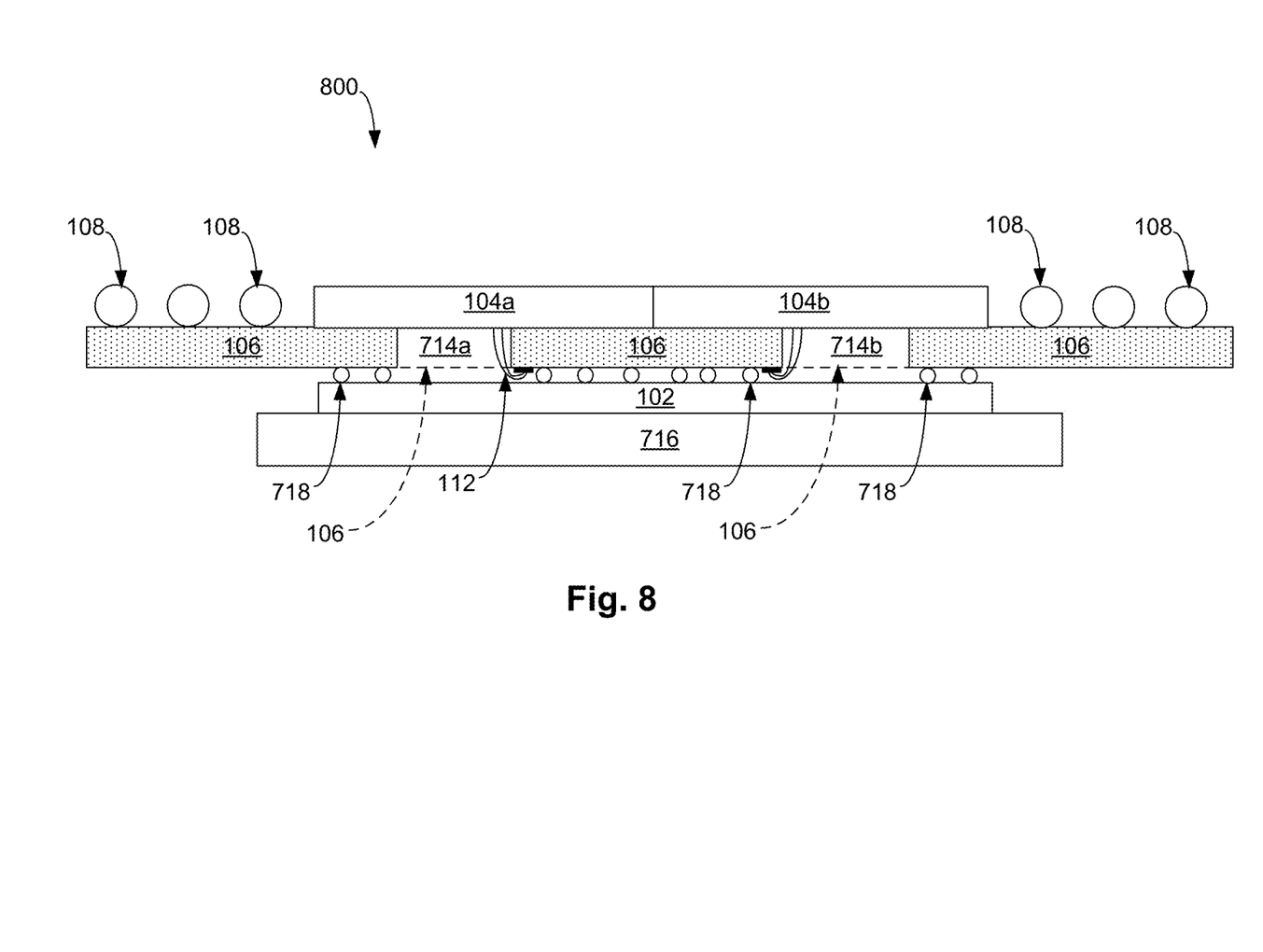

FIG. 8 illustrates a packaging arrangement 800 that is similar to the packaging arrangement 700 of FIG. 7. In the packaging arrangement 800 of FIG. 8, the SOC die 102 is wider than the SOC die 102 in the packaging arrangement 700 of FIG. 7. Thus, when the SOC die 102 with the heat sink 716 attached thereto is flip chip attached to the substrate 106, the SOC die 102 can be attached to the substrate 106 beyond the holes 714a, 714b defined within the substrate 106. The packaging arrangement 800 provides adequate cost for the packaging arrangement 800 and very good heat dissipation for the SOC die 102 as well as the memory die 104 due to the heat sink 716. Access to VDD and ground is generally adequate.

While the various packaging arrangements have been described and illustrated utilizing a memory die 104 that includes two memory dies 104a, 104b that are still attached to each other, it is to be noted that memory dies can be utilized that include only a single memory die. In such embodiments, the memory die will generally be narrower than the memory die 104 described and illustrated in FIGS. 1-8. Also, memory dies can be used that include more than two memory dies 104a, 104b that are still attached to each other. In such embodiments, the memory die will generally be wider and/or longer than the memory die 104 described and illustrated in FIGS. 1-8. The multi-memory dies 104 can include arrangements of individual memory dies 104a, 104b of one by two, two by two, two by three, etc. These examples are not meant to be limiting.

Figure 9:
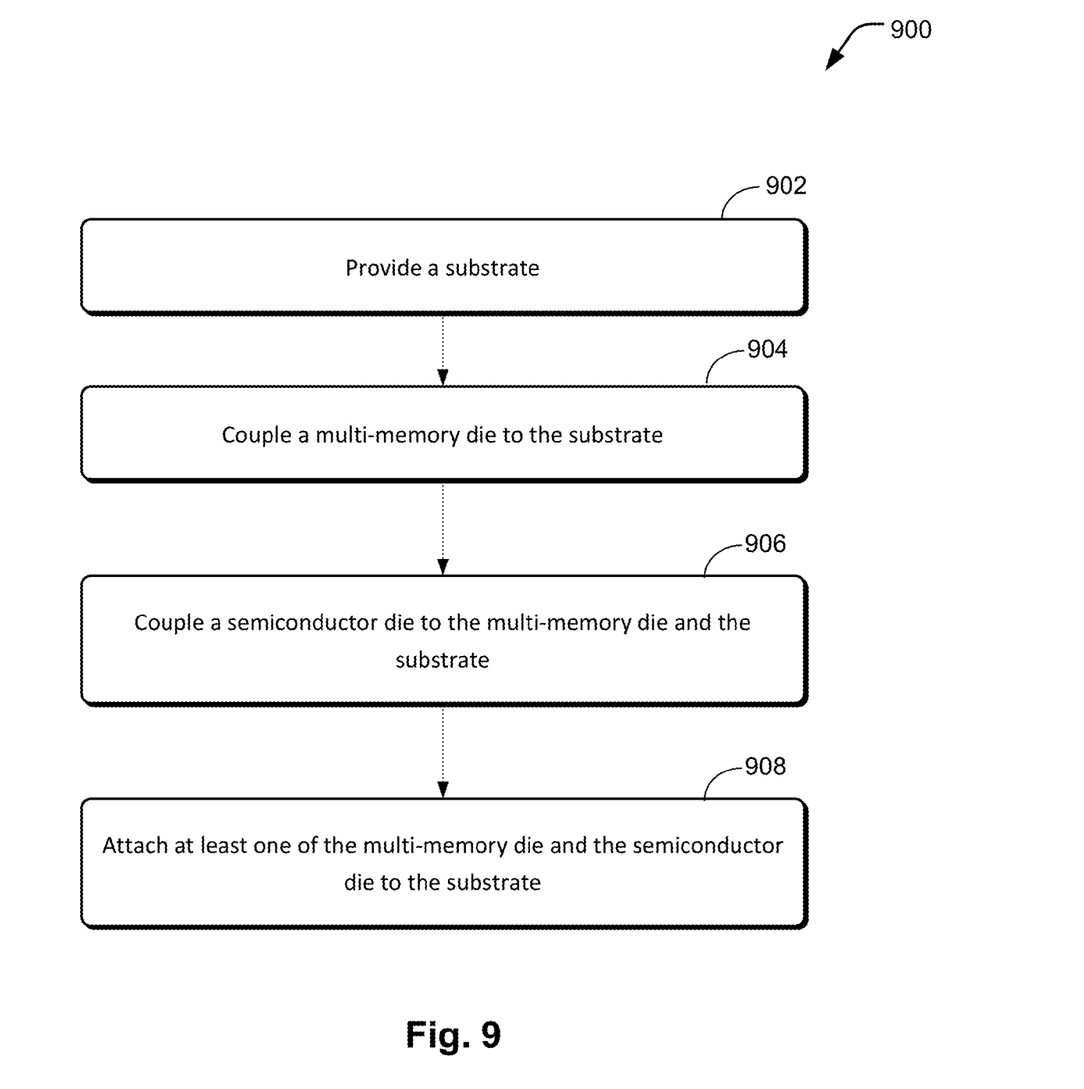
FIG. 9 illustrates an example of a method for creating a packaging arrangement that comprises a semiconductor die coupled to a multi-memory die comprising multiple individual memory dies.

FIG. 9 illustrates an example of a method 900 for creating a packaging arrangement, such as, for example, the packaging arrangements of FIGS. 1-8. At 902, a substrate is provided. At 904, a multi-memory die is coupled to the substrate. Each of the multiple individual memory dies is defined as an individual memory die within a wafer of semiconductor material during production of memory dies. The multi-memory die is created by singulating the wafer of semiconductor material into memory dies, where at least one of the memory dies is the multi-memory die that includes the multiple individual memory dies that are still physically connected together. At 906, a semiconductor die is coupled to the multi-memory die and the substrate. The semiconductor die is configured as a system on a chip. At 908, at least one of the multi-memory die and the semiconductor die is attached to the substrate.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the terms "embodiment" or "embodiments," which may each refer to one or more of the same or different embodiments. Furthermore, the terms "comprising," "including," "having," and the like, as used with respect to embodiments, are synonymous.

Although certain embodiments have been illustrated and described herein, it will be appreciated by those of ordinary skill in the art that a wide variety of alternate and/or equivalent embodiments or implementations calculated to achieve the same purposes may be substituted for the embodiments illustrated and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:
1. A packaging arrangement comprising:
a substrate;

a multi-memory die disposed on the substrate, wherein the multi-memory die comprises multiple individual memory dies and
    each of the multiple individual memory dies is defined as an individual memory die within a wafer of semiconductor material during production of memory dies, and
    the multi-memory die is created by singulating the wafer of semiconductor material into memory dies, where at least one of the memory dies is the multi-memory die that includes the multiple individual memory dies that are still physically connected together, wherein the multi-memory die comprises multiple individual memory dies including (i) a first individual memory die and (ii) a second individual memory die;
a semiconductor die coupled to the multi-memory die and the substrate, wherein the semiconductor die is disposed on the multi-memory die such that the multi-memory die is disposed between the substrate and the semiconductor die, wherein the semiconductor die is configured as a system on a chip, wherein at least one of the multi-memory die and the semiconductor die is attached to the substrate;
a first plurality of bond pads disposed on the first individual memory die;
a second plurality of bond pads disposed on the second individual memory die;
a third plurality of bond pads disposed (i) on the semiconductor die and (ii) near a first edge of the semiconductor die, wherein one or more of the first plurality of bond pads is coupled to a corresponding one or more of the third plurality of bond pads;
a fourth plurality of bond pads disposed (i) on the semiconductor die and (ii) near a second edge of the semiconductor die, wherein the second edge of the semiconductor die is opposite to the first edge of the semiconductor die, and wherein one or more of the second plurality of bond pads is coupled to a corresponding one or more of the fourth plurality of bond pads;
a fifth plurality of bond pads disposed (i) on the semiconductor die and (ii) near a third edge of the semiconductor die, wherein the third edge of the semiconductor die is perpendicular to the first edge of the semiconductor die; and
a sixth plurality of bond pads disposed on the substrate, wherein one or more of the fifth plurality of bond pads is coupled to a corresponding one or more of the sixth plurality of bond pads.

2. The packaging arrangement of claim 1, wherein the semiconductor die is coupled to the substrate via a wire bonding process.

3. The packaging arrangement of claim 1, further comprising a redistribution layer attached to the multi-memory die.

4. The packaging arrangement of claim 3, wherein the semiconductor die is coupled to the redistribution layer, and thereby the multi-memory die, via a wire bonding process.

5. The packaging arrangement of claim 1, wherein the multi-memory die is attached to the substrate via an epoxy or glue.

6. The packaging arrangement of claim 1, wherein the semiconductor die is attached to the multi-memory die via an epoxy or glue.

7. The packaging arrangement of claim 1, wherein:
the semiconductor die is disposed on a boundary between the first individual memory die and the second individual memory die.

8. A packaging arrangement comprising:
a substrate;
a multi-memory die disposed on the substrate, wherein the multi-memory die comprises multiple individual memory dies and
    each of the multiple individual memory dies is defined as an individual memory die within a wafer of semiconductor material during production of memory dies, and
    the multi-memory die is created by singulating the wafer of semiconductor material into memory dies, where at least one of the memory dies is the multi-memory die that includes the multiple individual memory dies that are still physically connected together;
a semiconductor die coupled to the multi-memory die and the substrate, wherein the semiconductor die is disposed on the multi-memory die such that the multi-memory die is disposed between the substrate and the semiconductor die, wherein the semiconductor die is configured as a system on a chip, wherein at least one of the multi-memory die and the semiconductor die is attached to the substrate, wherein the multi-memory die comprises multiple individual memory dies including (i) a first individual memory die and (ii) a second individual memory die;
a first plurality of bond pads disposed on the first individual memory die;
a second plurality of bond pads disposed on the second individual memory die;
a third plurality of bond pads disposed (i) on the semiconductor die and (ii) near a first edge of the semiconductor die, wherein one or more of the first plurality of bond pads is coupled to a corresponding one or more of the third plurality of bond pads; and
a fourth plurality of bond pads disposed (i) on the semiconductor die and (ii) near a second edge of the semiconductor die, wherein the second edge of the semiconductor die is opposite to the first edge of the semiconductor die, and wherein one or more of the second plurality of bond pads is coupled to a corresponding one or more of the fourth plurality of bond pads,
wherein the first plurality of bond pads is disposed (i) on the first individual memory die and (ii) near a first edge of the first individual memory die,
wherein the second plurality of bond pads is disposed (i) on the second individual memory die and (ii) near a first edge of the second individual memory die,
wherein a second edge of the first individual memory die is still physically connected to a second edge of the second individual memory die, and
wherein the first edge of the first individual memory die is opposite to and parallel to the second edge of the first individual memory die.

9. The packaging arrangement of claim 8, wherein the semiconductor die is coupled to the substrate via a wire bonding process.

10. The packaging arrangement of claim 8, further comprising a redistribution layer attached to the multi-memory die.

11. The packaging arrangement of claim 10, wherein the semiconductor die is coupled to the redistribution layer, and thereby the multi-memory die, via a wire bonding process.

12. The packaging arrangement of claim 8, wherein the multi-memory die is attached to the substrate via an epoxy or glue.

13. The packaging arrangement of claim 8, wherein the semiconductor die is attached to the multi-memory die via an epoxy or glue.

14. The packaging arrangement of claim 8, wherein:
the semiconductor die is disposed on a boundary between the first individual memory die and the second individual memory die.

15. The packaging arrangement of claim 8, further comprising:
a fifth plurality of bond pads disposed (i) on the semiconductor die and (ii) near a third edge of the semiconductor die, wherein the third edge of the semiconductor die is perpendicular to the first edge of the semiconductor die; and
a sixth plurality of bond pads disposed on the substrate, wherein one or more of the fifth plurality of bond pads is coupled to a corresponding one or more of the sixth plurality of bond pads.

* * * * *